(12) United States Patent
Jung et al.

(10) Patent No.: US 10,060,969 B2
(45) Date of Patent: Aug. 28, 2018

(54) TEST BOARD UNIT AND APPARATUS FOR TESTING A SEMICONDUCTOR CHIP INCLUDING THE SAME

(71) Applicants: SK hynix Inc., Icheon-si, Gyeonggi-do (KR); UNITEST INC., Yongin-si, Gyeonggi-do (KR)

(72) Inventors: Woo Sik Jung, Icheon-si (KR); Byoung Seon Koh, Yongin-si (KR); Hyo Jin Oh, Yongin-si (KR); Young Bae Choi, Yongin-si (KR); Jin Young Jung, Yongin-si (KR)

(73) Assignees: SK hynix Inc., Icheon-si, Gyeonggi-do (KR); UNITEST INC., Yongin-si, Gyeonggi-do (KR)

(*) Notice: Subject to any disclaimer, the term of this patent is extended or adjusted under 35 U.S.C. 154(b) by 256 days.

(21) Appl. No.: 14/846,053

(22) Filed: Sep. 4, 2015

(65) Prior Publication Data
US 2016/0262255 A1   Sep. 8, 2016

(30) Foreign Application Priority Data
Mar. 4, 2015   (KR) .................. 10-2015-0030467

(51) Int. Cl.
  *G01R 31/28*   (2006.01)
  *G01R 1/04*   (2006.01)

(52) U.S. Cl.
CPC ....... *G01R 31/2863* (2013.01); *G01R 1/0408* (2013.01)

(58) Field of Classification Search
CPC .................. G01R 31/2863; G01R 1/0408
USPC .................................... 324/750.09
See application file for complete search history.

(56) References Cited

U.S. PATENT DOCUMENTS 6,342,788 B1 * 1/2002 McAllister ......... G01R 31/2863
324/750.11

FOREIGN PATENT DOCUMENTS

KR   1020060128642 A   12/2006
KR   1020130023817 A   3/2013

* cited by examiner

*Primary Examiner* — Patrick Assouad
*Assistant Examiner* — Khristopher Yodichkas
(74) *Attorney, Agent, or Firm* — William Park & Associates Ltd.

(57) ABSTRACT

A test board unit may include a test board, a thermal tank and a heat-dissipating plate. The test board may be configured to provide a semiconductor chip with a test current. The thermal tank may be configured to dissipate heat generated in the semiconductor chip. The heat-dissipating plate may be coupled between the test board and the thermal tank and may be configured to transfer the heat from the semiconductor chip to the thermal tank.

14 Claims, 8 Drawing Sheets

TEST BOARD UNIT AND APPARATUS FOR TESTING A SEMICONDUCTOR CHIP INCLUDING THE SAME

CROSS-REFERENCES TO RELATED APPLICATION

The present application claims priority under 35 U.S.C. § 119(a) to Korean application number 10-2015-0030467 filed on Mar. 4, 2015 in the Korean Intellectual Property Office, which is incorporated herein by reference in its entirety.

BACKGROUND

1. Technical Field

Various embodiments generally relate to a test board unit and an apparatus for testing a semiconductor chip including the same. More particularly, the various embodiments relate to a test board unit capable of decreasing a temperature in a test board, providing a uniform temperature in a test board, and an apparatus for testing a semiconductor chip including the test board unit.

2. Related Art

Generally, after a fabrication (FAB) process is performed in a semiconductor fabrication process, a test process for testing electrical characteristics of a semiconductor chip may be performed on the semiconductor chip. According to the test process, the semiconductor chip is mounted on a test board in a test chamber. For example, the test process may include a burn-in test process in which the semiconductor chip performs normally or abnormally in a temperature higher than room temperature.

However, in the burn-in test process, test results may not have high reliability due to a temperature difference between a central portion and an edge portion of the test board.

SUMMARY

According to an example of an embodiment, there may be provided a test board unit. The test board unit may include a test board, a thermal tank and a heat-dissipating plate. The test board may be configured to provide a semiconductor chip with a test current. The thermal tank may be configured to dissipate heat generated in the semiconductor chip. The heat-dissipating plate may be coupled between the test board and the thermal tank and may be configured to transfer the heat from the semiconductor chip to the thermal tank.

According to an example of an embodiment, there may be provided a test board unit. The test board unit may include a test board, a thermal tank and a heat-dissipating via. The test board may be configured to provide a semiconductor chip with a test current.

The thermal tank may be configured to dissipate heat generated in the semiconductor chip. The heat-dissipating via may be formed in the test board to electrically couple the semiconductor chip with the thermal tank.

According to an example of an embodiment, there may be provided an apparatus for testing a semiconductor chip. The apparatus may include a test board, a socket, a thermal tank and a heat-dissipating plate. The test board may be configured to provide the semiconductor chip with a test current. The socket may be installed at the test board and may be configured to hold the semiconductor chip. The thermal tank may be configured to dissipate heat generated in the semiconductor chip. The heat-dissipating plate may be coupled between the test board and the thermal tank and may be configured to transfer the heat from the semiconductor chip to the thermal tank.

According to an example of an embodiment, there may be provided an apparatus for testing a semiconductor chip. The apparatus may include a test board, a socket, a thermal tank and a heat-dissipating via. The test board may be configured to provide the semiconductor chip with a test current. The socket may be installed at the test board and may be configured to hold the semiconductor chip. The thermal tank may be configured to dissipate heat generated in the semiconductor chip. The heat-dissipating via may be formed in the test board and may be configured to electrically couple the semiconductor chip with the thermal tank.

According to an example of an embodiment, there may be provided a test board unit. The test board unit may include a test board and a heat-dissipating via. An upper pattern may be arranged on an upper surface of the test board. A lower pattern may be arranged on a lower surface of the test board. The heat-dissipating via may be configured to transmit electrical signals between the upper pattern and the lower pattern. The heat may be transferred through the heat-dissipating via.

The socket may be arranged on a first surface of the test board, and the heat-dissipating plate may be arranged on a second surface of the test board opposite to the first surface.

The thermal tank may include at least one heat-dissipating fin located on a lower surface of the thermal tank. Further, the thermal tank may include at least one heat pipe located on a lower surface of the thermal tank.

DETAILED DESCRIPTION

Figure 1:
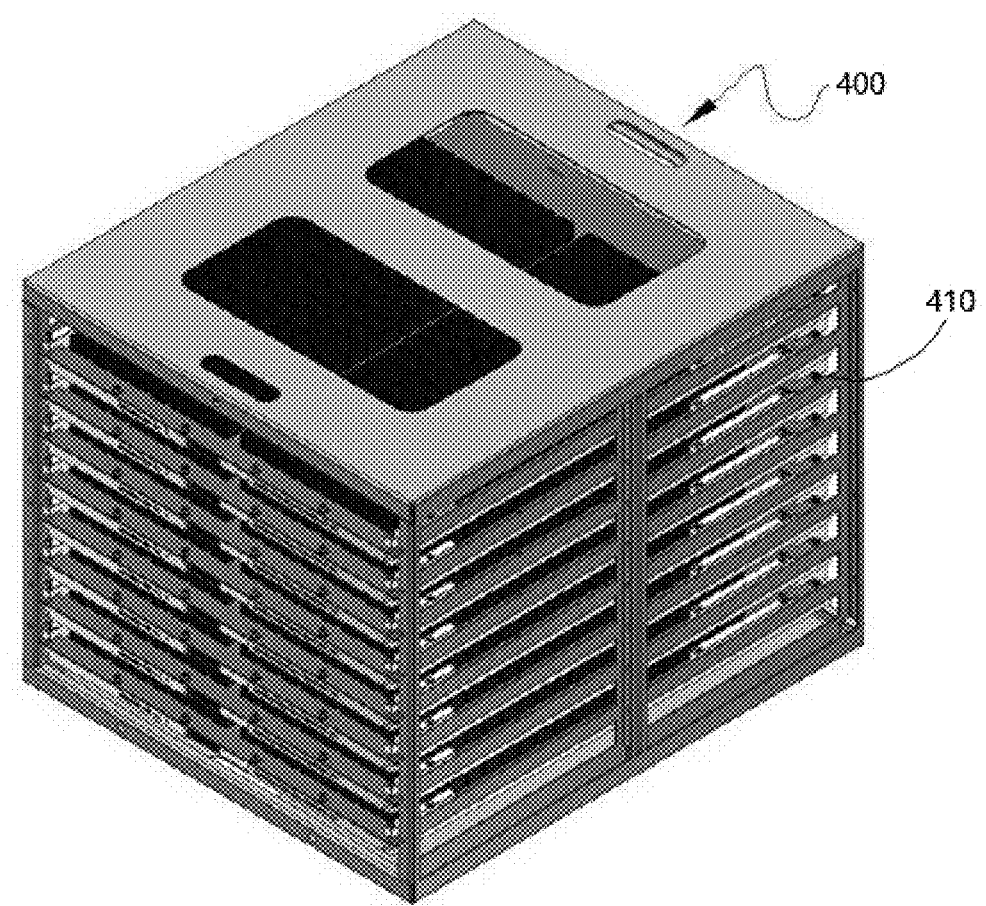
FIG. 1 is a perspective view illustrating a representation of a rack of a test chamber in a test apparatus in accordance with various examples of embodiments.

Various examples of the embodiments will be described more fully hereinafter with reference to the accompanying drawings, in which some examples of the embodiments are illustrated. The embodiments may, however, be embodied in many different forms and should not be construed as limited to the examples set forth herein. Rather, these examples of the embodiments are provided so that this disclosure will be thorough and complete, and will fully convey the scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of the embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Examples of the embodiments are described herein with reference to cross-sectional illustrations that are schematic illustrations of idealized examples of the embodiments (and intermediate structures). As such, variations from the shapes of the illustrations as a result, for example, of manufacturing techniques and/or tolerances, are to be expected. Thus, examples of the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless is expressly so defined herein.

Hereinafter, examples of the embodiments will be explained with reference to the accompanying drawings.

A test board unit of this example of an embodiment may be received in a test chamber. The test chamber may include a circulating fan and a nozzle duct configured to cool the test board unit in a test process.

FIG. 1 is a perspective view illustrating a representation of a rack of a test chamber in a test apparatus in accordance with various examples of embodiments.

Referring to FIG. 1, the test chamber may include at least one rack 400. The rack 400 may include a plurality of slots 410 into which test boards may be inserted.

Figure 2:
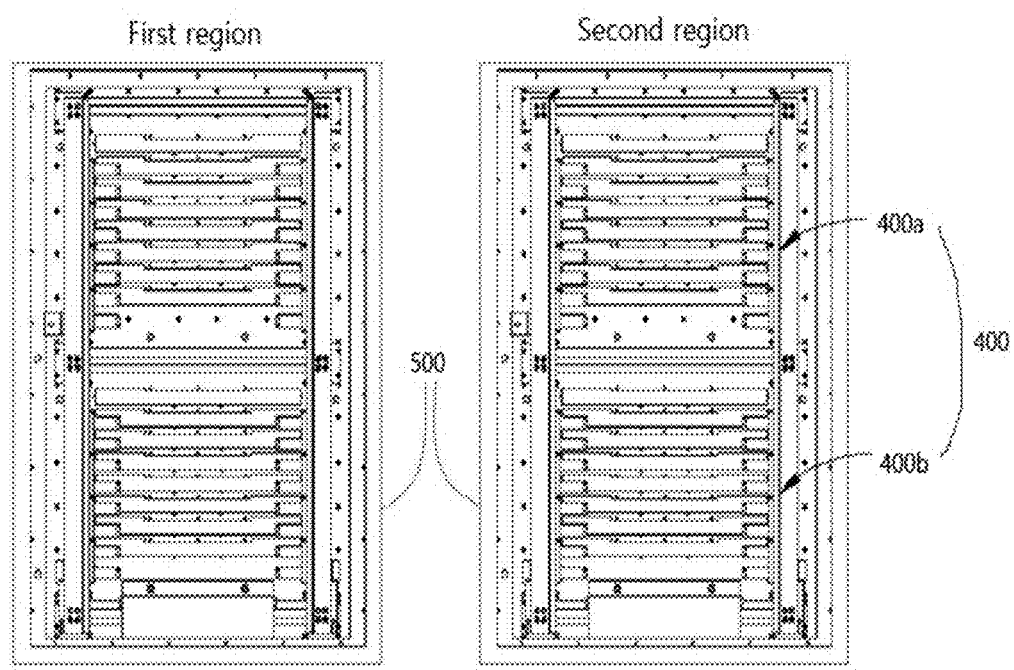
FIG. 2 is a plan view illustrating a representation of an example of a single rack inserted into the test chamber.

FIG. 2 is a plan view illustrating a representation of an example of a single rack inserted into the test chamber.

Referring to FIG. 2, the test chamber may be divided into at least one region 500. The region 500 (i.e. first region or second region) may include two stacked racks 400a and 400b.

Figure 3:
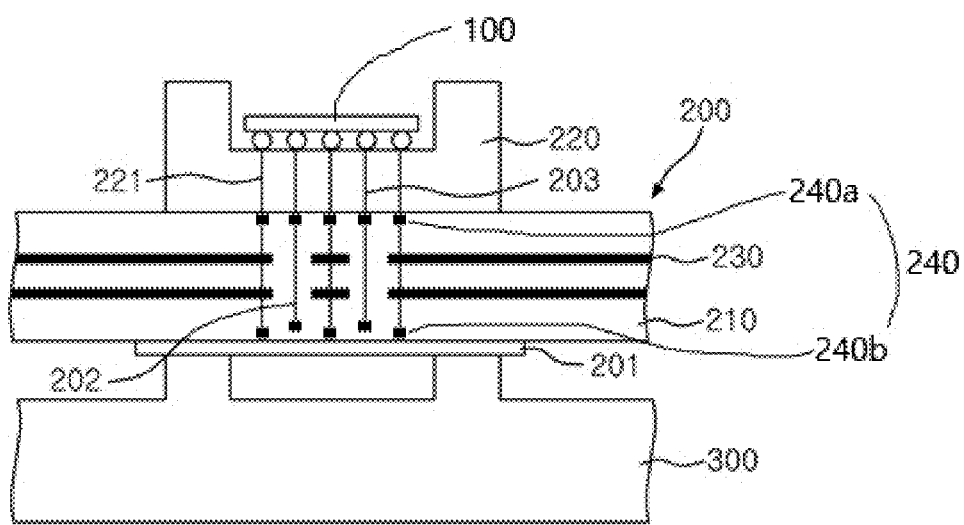
FIG. 3 is a cross-sectional view illustrating a representation of an example of the test chamber including four racks.
Figure 4:
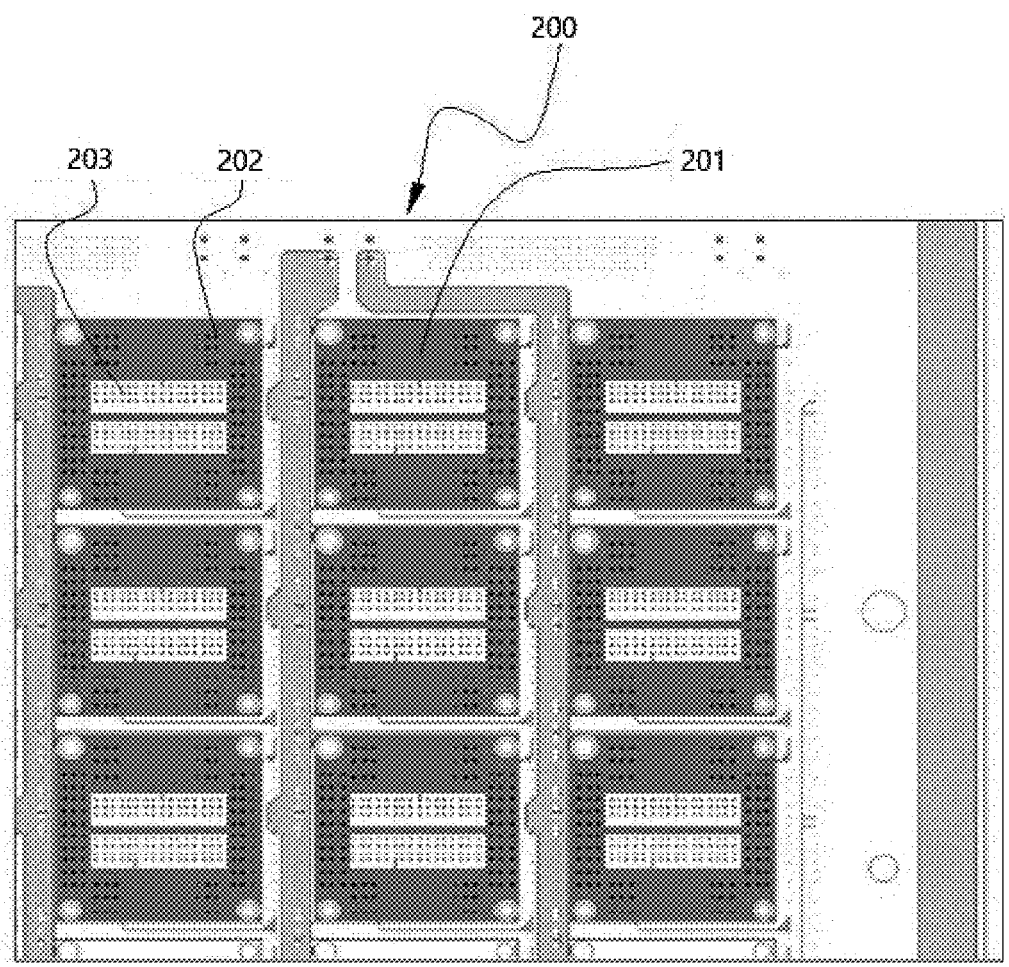
FIG. 4 is a plan view illustrating a representation of an example of a test board unit of the test apparatus.

FIG. 3 is a cross-sectional view illustrating a representation of an example of the test chamber including four racks, and FIG. 4 is a plan view illustrating a representation of an example of a test board unit of the test apparatus.

Referring to FIGS. 3 and 4, the test board unit 200 may be inserted into the racks 400a and 400b (i.e., see FIG. 2). The test board unit 200 may include a test board 210, a socket 220, a is conductive member (not illustrated) and a thermal tank 300.

The test board 210 may be installed in a personal computer. The test board 210 may include signal lines (not illustrated) configured to transmit operational signals to a semiconductor chip 100 in the socket 220. The test board 210 may provide the semiconductor chip 100 with a test current. Thus, the test board 210 may include one and more test patterns 240 electrically connected to the semiconductor chip 100. The test patterns 240 may include an upper pattern 240a and a lower pattern 240b.

The socket 220 may be arranged on an upper surface of the test board 210. The semiconductor chip 100 may be mounted on the socket 220.

The conductive member may include signal lines configured to transmit operational signals to the semiconductor chip 100 in the socket 220. For example, the conductive member may include an address line configured to provide the semiconductor chip 100 with an address signal. For example, the conductive member may include a command line configured to provide the semiconductor chip 100 with an input signal. For example, the conductive member may include a power line and a ground line 230 configured to provide the semiconductor chip 100 with a power. In this example of an embodiment, the conductive member may include the ground line 230.

The conductive member may include a heat-dissipating plate 201 and a heat-dissipating via 202. The heat-dissipating plate 201 may make close contact with a lower surface of the test board 210. The heat-dissipating via 202 may be configured to transmit electrical signals between the upper pattern and the lower pattern of the test pattern. Heat generated from the semiconductor chip 100 may be transferred to the heat-dissipating plate 201 through the heat-dissipating via 202.

The heat-dissipating plate 201 may have an area substantially similar to an area of the lower surface of the test board 210. The heat-dissipating plate 201 may be configured to surround electrode terminals 203 of the socket 220 through which the heat may be transferred.

The electrical signals may be transmitted between the upper pattern and the lower pattern of the test pattern through the heat-dissipating via 202. Thus, the heat-dissipating via 202 may have a function for electrically connecting the heat-dissipating plate 201 with a ground terminal of the semiconductor chip 100 as well as a function for electrically connecting the ground line 230 to the ground terminal of the semiconductor chip 100. The socket 220 may include a conductive via 221 configured to electrically connect the ground line 230 of the test board 210 with the ground terminal of the semiconductor chip 100.

The heat-dissipating plate 201 may be configured to surround the electrode terminals 203 of the socket 220. The heat-dissipating via 202 may be configured to surround the electrode terminals 203 of the socket 220 in a region surrounded by the heat-dissipating plate 201. The heat-dissipating via 201 may include a thermal via having an inner surface on which a copper layer may be formed.

Figure 5:
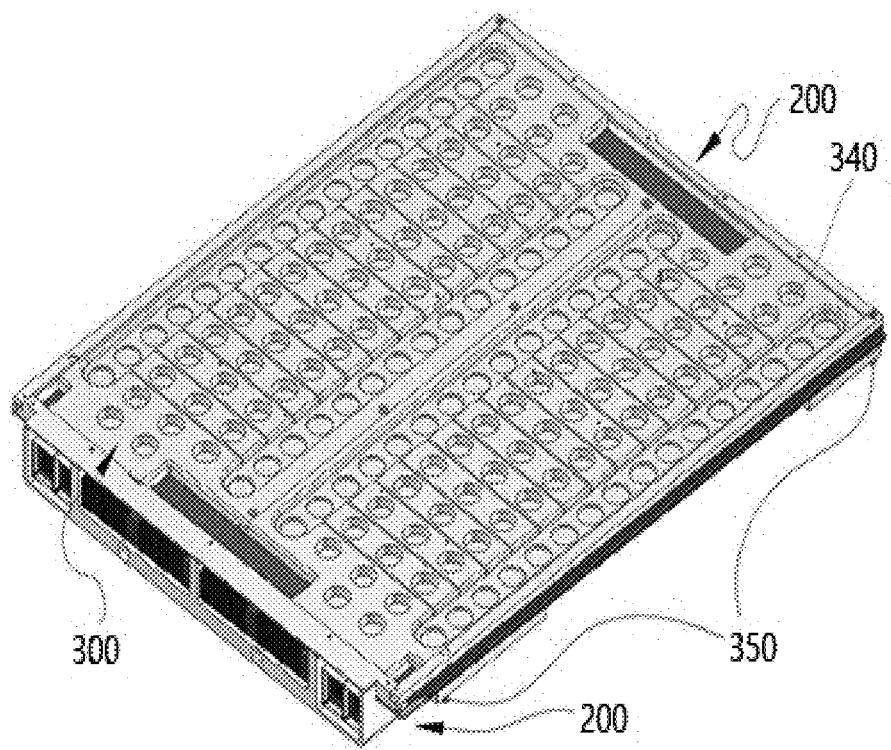
FIG. 5 is a perspective view illustrating a representation of an example of the test board including a thermal tank.
Figure 6:
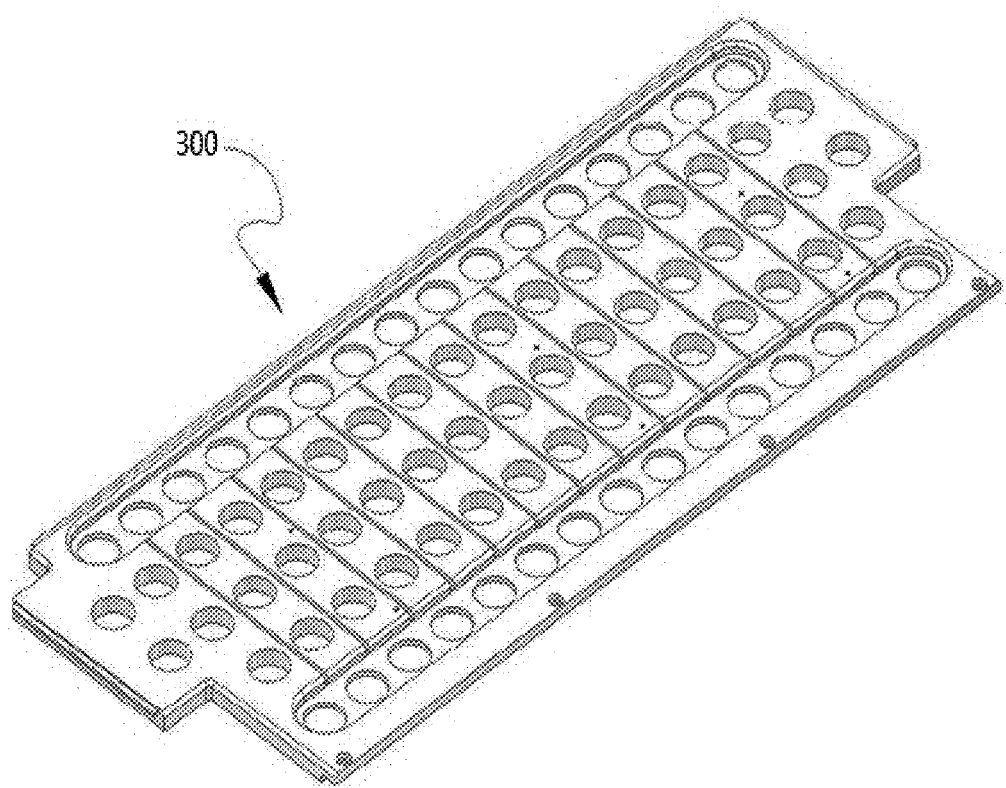
FIG. 6 is a perspective view illustrating a representation of an example of the test board including the thermal tank.

FIG. 5 is a perspective view illustrating a representation of an example of the test board including a thermal tank, and FIG. 6 is a perspective view illustrating a representation of an example of the test board including the thermal tank.

Referring to FIGS. 5 and 6, the thermal tank 300 may be combined with the lower surface of the test board 210 (i.e., see FIG. 3) using a fixing member 350. The thermal tank 300 may have an upper surface configured to closely make contact with the heat-dissipating plate 201. Thus, any air gap may not be formed between the thermal tank 300 and the heat-dissipating plate 201.

A plurality of heat-dissipating fins (not illustrated) may be arranged on a lower surface of the thermal tank 300. Alternatively, a heat pipe (not illustrated) may be arranged on the lower surface of the thermal tank 300. The heat-dissipating fins or the heat pipe may be uniformly distributed on the lower surface of the thermal tank 300. Alternatively, the heat-dissipating fins or the heat pipe may be concentrated on and/or distributed on a central portion of the lower surface of the thermal tank 300.

When the thermal tank 300 is electrically connected with an external device, noises from the external device may change electrical characteristics of the semiconductor chip 100. Thus, the thermal tank 300 may be separated from the external device. Alternatively, an insulating layer may be formed on an outer surface of the thermal tank 300.

The thermal tank 300 may not be restricted within a specific shape. The thermal tank 300 may have a passageway through which air may pass in a thickwise direction of the thermal tank 300 so as to provide the test board 210 with uniform heat flow. The thermal tank 300 may have a passageway(s) through which gases may pass through the thermal tank 300 so as to provide the test board 210 with uniform heat flow.

As mentioned above, the thermal tank 300 may include the heat-dissipating fins or the heat pipes. The thermal tank 300 may have a plurality of grooves 340 or holes. FIG. 5 also illustrates a test board unit 200.

Figure 7:
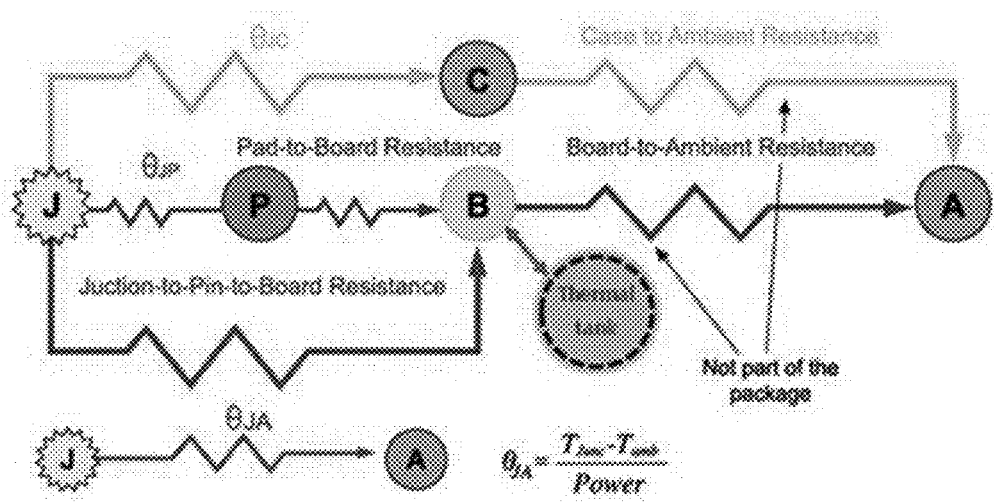
FIG. 7 is a diagram illustrating a representation of an example of heat transfer paths of the test board with the thermal tank and a test board without a thermal tank.

FIG. 7 is a diagram illustrating a representation of an example of heat transfer paths of the test board with the thermal tank and a test board without a thermal tank.

FIG. 7 illustrates a representation of an example of thermal resistances in accordance with heat dissipation passageways of the heat generated from the semiconductor chip. In FIG. 7, a symbol of an electrical resistance may represent the heat resistance. The thermal resistance may be proportional to a size of the symbol of the electrical resistance.

In FIG. 7, $\theta_{JC}$, $\theta_{JP}$ and $\theta_{JA}$ may represent a thermal resistance measured under a condition that the heat may flow from a high temperature to a low temperature when two objects (at least two of A, B, C, J and P) having different temperatures (T1, T2) are connected with each other. That is, the T1 may be a temperature of a first object (A, B, C, J or P) and the T2 may be a temperature of a second object (A, B, C, J or P) being different from the first object (A, B, C, J or P). The thermal resistance $\theta_{JC}$, $\theta_{JP}$ and $\theta_{JA}$ may be inversely proportional to a consumption power with respect to a current flowing through a connection point between the objects (A, B, C, J or P) or a heating value of the power. The thermal resistance $\theta$ may be proportional to a temperature difference (T2-T1) between the objects. The node J may be a junction of a transistor in a chip, the node P may be an electrical bonding pad in the chip, the node C may be a case for covering the chip, the node B may be a test board connected to the pad and the node A may be an atmosphere which is positioned outside the chip.

Therefore, the thermal resistance may be increased at a position where the power consumption may be about 0. In contrast, when the heat may be transferred through a path of the electrical signal, the thermal resistance may be decreased to transfer the heat compared than when the heat may be directly dissipated from the semiconductor chip 100. That is, it can be noted that the heat may be transferred through connection points between the socket 220 and the test board 210 to improve heat dissipation efficiency (i.e., see FIG. 3).

In order to rapidly dissipate the heat through the electrical signal path, the heat-dissipating plate 201 may closely make contact with the thermal tank 300 without the air gap.

The heat dissipating efficiency may be proportional to a size of the test board 210 and numbers of the heat-dissipating via 202, i.e., electrical connections between the semiconductor chip 100 and the thermal tank 300. Thus, the heat in the semiconductor chip 100 may be rapidly dissipated by increasing the electrical connections between the semiconductor chip 100 and the thermal tank 300.

According to an example of an embodiment, the conductive member and the thermal tank may be capable of effectively dissipating the heat from the test board and uniformly distributing the heat in the test board.

Figure 8:
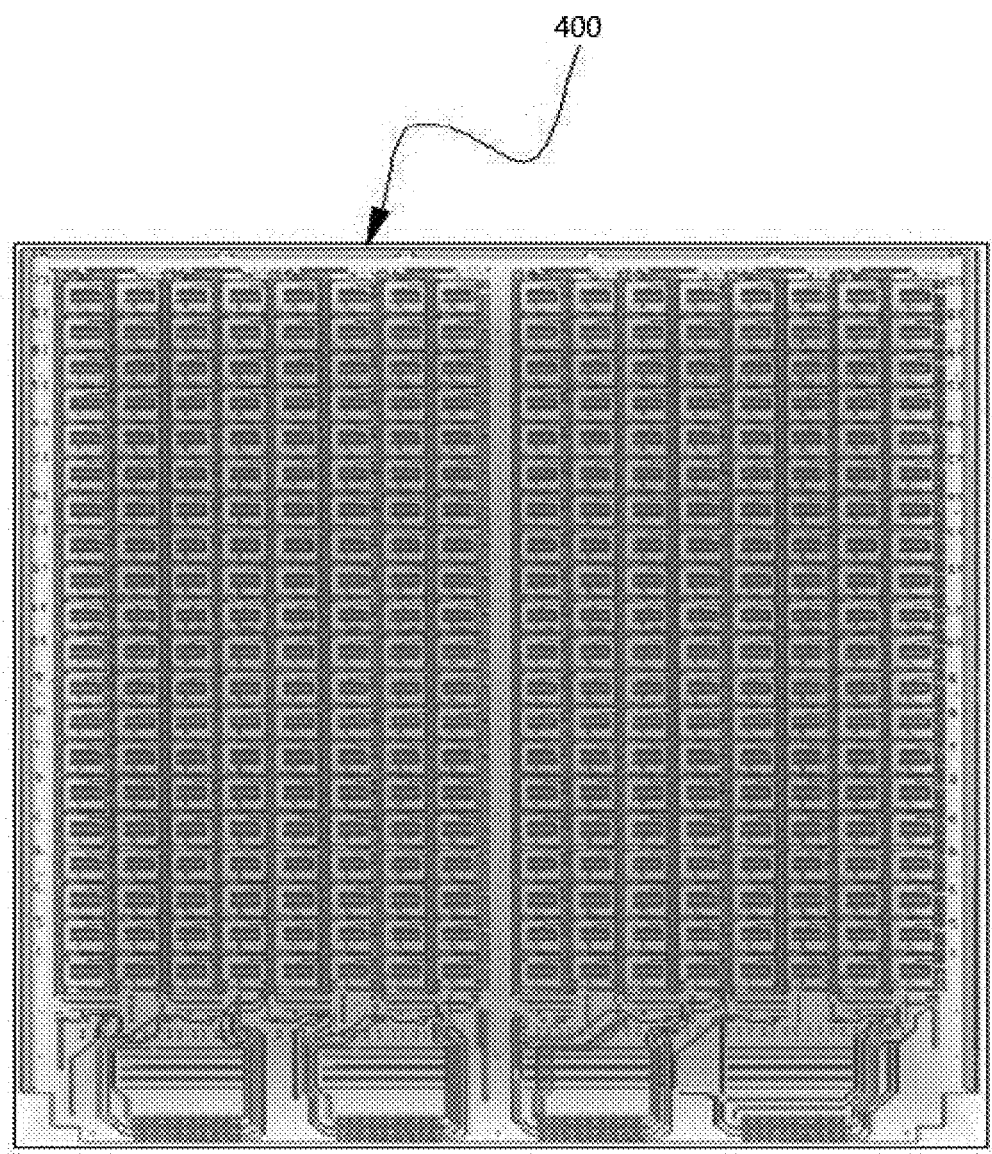
FIG. 8 is a plan view illustrating a representation of an example of a heat distribution on the test board with the thermal tank.

FIG. 8 is a plan view illustrating a representation of an example of a heat distribution on the test board with the thermal tank.

Referring to FIG. 8, it can be noted that thermal intensity of the test board unit 200 may be uniformly distributed when the thermal tank 300 may be applied to the test board 210 (i.e., see FIG. 3). FIG. 8 illustrates a rack 400.

According to examples of the embodiments, the heat may be transferred through the numerous electrical signal paths to improve the heat dissipating efficiency from the test board.

Further, the heat may not be concentrated on the central portion of the test board by rapidly dissipating the heat so that the test board may have uniform temperature distribution.

Furthermore, the rapid heat dissipating and the uniform temperature distribution may be obtained using the test board unit having the simple structure so that the test apparatus may have a low cost.

While various embodiments have been described above, it will be understood to those skilled in the art that the embodiments described are by way of example only. Accordingly, the circuit and method described herein should not be limited based on the described embodiments.

What is claimed is:

1. A test board unit comprising:
    a test board configured to provide a semiconductor chip with a test current;
    a thermal tank configured to dissipate heat generated from the semiconductor chip and to include at least one heat-dissipating hole; and
    a heat-dissipating plate interposed between the test board and the thermal tank and configured to transfer the heat to the thermal tank,
    wherein the heat-dissipating plate includes a first surface facing the test board and a second surface facing the thermal tank, and
    a whole of the first surface of the heat-dissipating plate is contacted with the test board and the second surface of the heat-dissipating plate includes a first portion contacted with the thermal tank and a second portion isolated from the thermal tank by the heat-dissipating hole.

2. The test board unit of claim 1, further comprising an insulating layer formed on an outer surface of the thermal tank.

3. The test board unit of claim 1, further comprising a heat-dissipating via arranged in the test board to electrically connect the semiconductor chip with the heat-dissipating plate.

4. The test board unit of claim 3, wherein the heat-dissipating via includes a thermal via having a copper layer formed on an inner surface of the thermal via.

5. The test board unit of claim 1, wherein the test board comprises a test pattern configured to provide the semiconductor chip with the test current, and the heat-dissipating plate is electrically connected to the test pattern.

6. A test board unit comprising:
    a test board configured to provide a semiconductor chip with a test current;
    a heat-dissipating plate including a first surface attached to the test board and a second surface;
    a thermal tank configured to dissipate heat generated from the semiconductor chip and to partially contact with the second surface of the heat-dissipating plate, which is opposite to the first surface and to include at least one heat-dissipating hole; and
    a heat-dissipating via formed in the test board to electrically couple the semiconductor chip with the thermal tank,
    wherein the thermal tank is partially contacted with the second surface of the heat-dissipating plate.

7. The test board unit of claim 6, wherein the thermal tank is electrically coupled to the semiconductor chip of the test board through the heat-dissipating plate and the heat-dissipating via.

8. The test board unit of claim 7, wherein substantially no gap exists between the heat-dissipating plate and the test board.

9. The test board unit of claim 6, further comprising an insulating layer formed on an outer surface of the thermal tank.

10. The test board unit of claim 6, wherein the test board comprises a test pattern configured to provide the semiconductor chip with the test current, and the heat-dissipating plate is electrically connected to the test pattern.

11. An apparatus for testing a semiconductor chip, the apparatus comprising:
    a test board configured to provide the semiconductor chip with a test current;
    a socket arranged on the test board and configured to accept the semiconductor chip;
    a thermal tank configured to dissipate heat generated from the semiconductor chip and to include at least one heat-dissipatinq hole; and
    a heat-dissipating plate coupled between the test board and the thermal tank and configured to transfer the heat to the thermal tank,
    wherein the heat-dissipating plate includes a first surface facing the test board and a second surface facing the thermal tank, and
    a whole of the first surface of the heat-dissipating plate is contacted with the test board and the second surface includes a first portion contacted with the thermal tank and a second portion isolated from the thermal portion by the heat-dissipating hole.

12. The apparatus of claim 11, wherein the socket is arranged on a first surface of the test board, and the heat-dissipating plate is arranged on a second surface of the test board opposite to the first surface of the test board.

13. The apparatus of claim 11, wherein the socket comprises electrode terminals electrically connected to the semiconductor chip, and the heat-dissipating plate is configured to surround the electrode terminals of the socket.

14. The apparatus of claim 11, further comprising a heat-dissipating via arranged in the test board to electrically connect the semiconductor chip with the heat-dissipating plate,
    wherein the socket is arranged to overlap with the heat-dissipating via.

* * * * *